(12) United States Patent
Kim

(10) Patent No.: US 10,868,406 B2
(45) Date of Patent: Dec. 15, 2020

(54) UNIDIRECTIONALLY OSCILLATING MICRO DISK LASER

(71) Applicant: Daegu Gyeongbuk Institute of Science and Technology, Daegu (KR)

(72) Inventor: Chil Min Kim, Seoul (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 16/466,513

(22) PCT Filed: Oct. 12, 2017

(86) PCT No.: PCT/KR2017/011217
§ 371 (c)(1),
(2) Date: Jun. 4, 2019

(87) PCT Pub. No.: WO2018/110816
PCT Pub. Date: Jun. 21, 2018

(65) Prior Publication Data
US 2020/0067272 A1 Feb. 27, 2020

(30) Foreign Application Priority Data
Dec. 16, 2016 (KR) .......................... 10-2016-0172925

(51) Int. Cl.
*H01S 5/10* (2006.01)
*H01S 3/06* (2006.01)
(Continued)

(52) U.S. Cl.
CPC .......... *H01S 5/1075* (2013.01); *H01S 3/0627* (2013.01); *H01S 3/08086* (2013.01); *H01S 5/34* (2013.01); *B82Y 20/00* (2013.01)

(58) Field of Classification Search
CPC .. H01S 5/1075; H01S 3/0627; H01S 3/08086; H01S 5/34; H01S 5/34306
See application file for complete search history.

(56) References Cited

U.S. PATENT DOCUMENTS

2006/0002445 A1* 1/2006 Kim ...................... H01S 3/0604
372/66
2017/0093129 A1* 3/2017 Baik ......................... H01S 5/24

FOREIGN PATENT DOCUMENTS

JP    62-137888 A       6/1987
KR  10-2006-0001735 A   1/2006
(Continued)

OTHER PUBLICATIONS

Sun-Kyung Kim, Se-Heon Kim, Guk-Hyun Kim, Hong-Gyu Park, Dong-Jae Shin, and Yong-Hee Lee; Highly Directional Emission From Few-Micron-Size Elliptical Microdisks; Applied Physics Letters, vol. 84, No. 6, Feb. 9, 2004, 5 pages.
(Continued)

*Primary Examiner* — Yuanda Zhang
(74) *Attorney, Agent, or Firm* — Burris Law, PLLC

(57) ABSTRACT

A micro disk laser having a greater strength of oscillation in one direction than in another direction and unidirectionally oscillating includes a micro disk having an oval shape corresponding to a modified ellipse obtained by changing a length of a short axis of an ellipse according to a position of a long axis while lengths of first and second side portions of the long axis are fixed in the ellipse, the ellipse having the long axis and the short axis having a different length than the long axis.

9 Claims, 8 Drawing Sheets

(51) Int. Cl.
  *H01S 3/08* (2006.01)
  *H01S 5/34* (2006.01)
  *B82Y 20/00* (2011.01)

(56) References Cited

FOREIGN PATENT DOCUMENTS

| KR | 10-1401920 B1 | 5/2014 |
| KR | 10-1516690 B1 | 5/2015 |
| WO | 2012-154209 A1 | 11/2012 |

OTHER PUBLICATIONS

International Search Report for PCT/KR2017/011217 dated Jan. 11, 2018, 2 pages.

\* cited by examiner

UNIDIRECTIONALLY OSCILLATING MICRO DISK LASER

RELATED APPLICATIONS

The present application is a 371 U.S. national phase entry of PCT Application No. PCT/KR2017/011217 filed Oct. 12, 2017, which claims priority to Korean Application No. 10-2016-0172925, filed Dec. 16, 2016, all of which are hereby incorporated in their entirety by reference as set forth herein.

TECHNICAL FIELD

The present disclosure relates to a micro disk laser emitting in one direction, and more particularly, to a micro disk laser capable of emitting in one direction via an oval-shaped structure even when the diameter thereof is equal to or less than the size of an emission wavelength.

BACKGROUND ART

Recently, there has been a lot of research into developing light sources of optical electronic circuits using a micro-resonator having a size equal to or less than a wavelength emitting in one direction. Such research has been made to develop light sources for generating an optical signal transmittable through optical fiber instead of an electric wire in a central processing unit (CPU) of a computer so as to solve problems (including a driving speed limit of the CPU) caused by impedance that may occur when the electric wire is used in the CPU. To achieve the objective of the research, it is necessary to develop micro light sources sufficiently small to be integrated into a CPU, but it is not easy to develop such light sources. Recently, nano-lasers less than micrometers in size have been developed. Such nano-lasers are manufactured using nanowires and do not operate at room temperature but operate only at a temperature of several tens of Kelvin (K). In addition, the nano-lasers are excited by light since there is no way to excite nano-lasers with current, and therefore, the nano-lasers cannot be used in practice as light sources that are excited by current in optical electronic circuits.

To solve this problem, it is necessary to develop extremely small lasers, which have a size equal to or less than a wavelength and can be driven by current even in a semiconductor state at room temperature. There have been many efforts to develop such lasers, but no lasers that have a size equal to or less than a wavelength and are driven by current have been developed. The problems described above may be solved by developing extremely small lasers emitting in one direction. Unidirectionally emitting micro disk lasers having various structures have been developed. The various structures include a spiral structure, a rounded triangular structure, a Limagon structure, an elliptical structure with a groove, and a combination of a semicircle and a semiellipse. In these structures, even if lasers unidirectionally emit, the size of the lasers cannot be reduced to be equal to or less than a wavelength. The smallest lasers up to now have a diameter of at least about 10 mm, which is greater than a wavelength. This is because lasers having these structures are resonators having a chaotic structure. Waves need to be confined inside the resonators that have a chaotic structure. However, when the path of resonators inside which waves are confined is set, the directionality of laser emission deteriorates. In other words, there is no known disk laser that has unidirectional emission and has a diameter equal to or less than a wavelength.

It is urgently desired to develop a micro resonator (or disk) having a new shape, of which the diameter is equal to or less than a wavelength, to solve the problems described above.

DESCRIPTION OF EMBODIMENTS

Technical Problem

Provided is a unidirectionally emitting micro disk laser, of which the emission intensity is greater in one direction than in another direction via a figure called an oval shape, and which has the directionality of emission.

Provided is also a micro disk laser capable of emitting in one direction even when the micro disk laser has a size equal to or less than an emission wavelength.

Solution to Problem

According to an aspect of the present disclosure, a micro disk laser, which has a greater emission intensity in one direction than in another direction and unidirectionally emits, includes a micro disk having an oval shape corresponding to a modified ellipse obtained by changing a length of a axis parallel to a short axis of an ellipse according to a position of a long axis while lengths of first and second side portions of the long axis are fixed in the ellipse, the ellipse having the long axis and the short axis having a different length than the long axis.

Advantageous Effects of Disclosure

According to an embodiment, a micro disk laser has an oval-shaped structure and has a characteristic of unidirectional emission, by which the emission intensity is greater in one direction than in another direction.

In addition, when a size of the micro disk laser is less than an emission wavelength, a wavelength is confined inside a resonator due to the uncertainty principle, and the confined wavelength may unidirectionally emit with a greater emission intensity in one direction than in another direction.

Accordingly, the micro disk laser smaller than the emission wavelength may be used as a light source in optical electronic circuits, e.g., in the field of chip-to-chip optical interconnection.

Figure 3A:
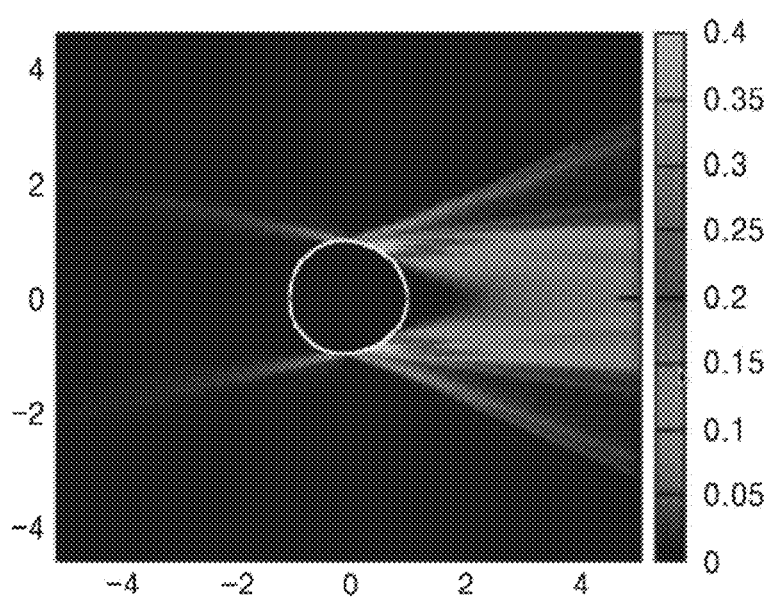
FIG. 3A is a diagram of a shape, in which light spreads out of a resonator, obtained using ray tracing when variables δ and ε defining the shape of a micro disk are 1.06 and 0.13, respectively, and a refractive index of a quantum well layer is 3.3.
Figure 3B:
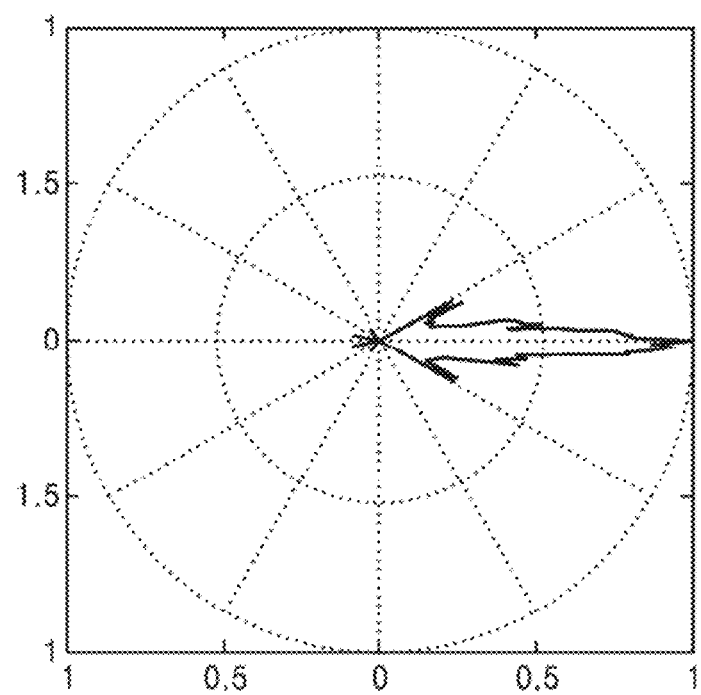

FIG. 3B is a diagram of a far-field pattern showing the directionality of light at a long range using ray tracing.

Figure 4:
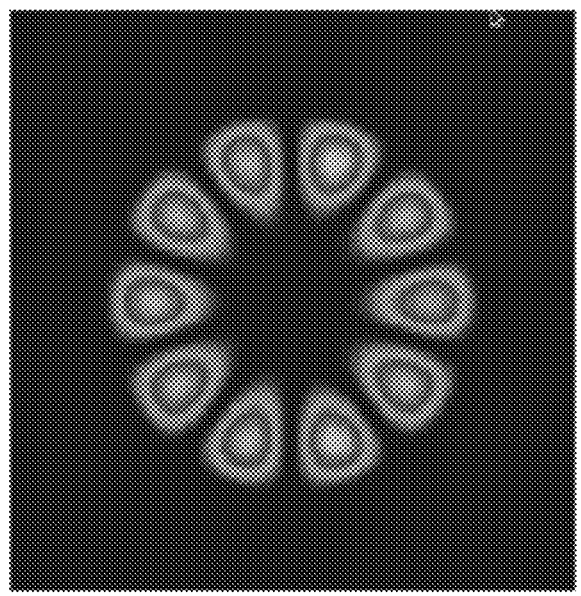

FIG. 4 shows a result of estimating a wave function, in which five waves are confined to a boundary surface, when variables δ and ε defining the shape of a micro disk are 1.06 and 0.13, respectively, and a refractive index of a quantum well layer is 3.3.

Figure 5:
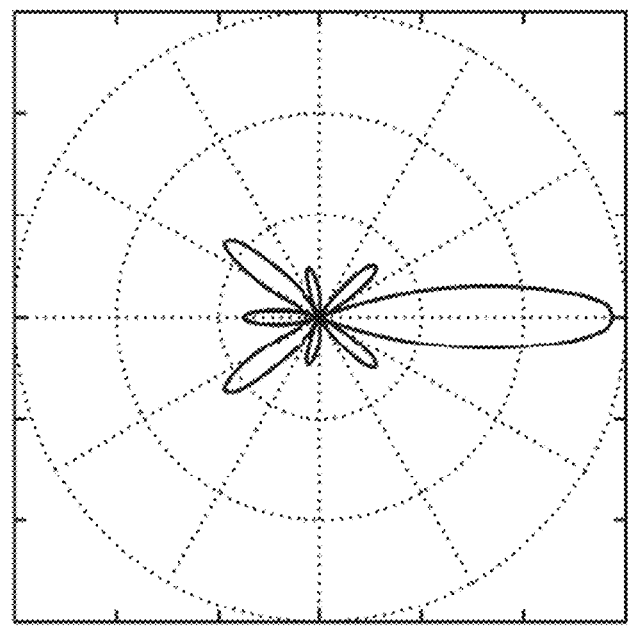

FIG. 5 shows the directionality of emission of a wave function, in which five waves are confined to a boundary surface, when variables δ and ε defining the shape of a micro disk are 1.06 and 0.13, respectively, and a refractive index of a quantum well layer is 3.3.

BEST MODE

According to an aspect of the present disclosure, a micro disk laser, which has a greater emission intensity in one direction than in another direction and unidirectionally emits, includes a micro disk having an oval shape corresponding to a modified ellipse obtained by changing a length of an axis parallel to a short axis of an ellipse according to a position of a long axis while lengths of first and second side portions of the long axis are fixed in the ellipse, the ellipse having the long axis and the short axis having a different length than the long axis.

The micro disk may include a curved surface only, and left and right sides of the micro disk may be asymmetrical with each other with respect to the short axis.

An area on the left side of the short axis may be different from an area on the right side of short axis in the modified ellipse of the micro disk, and an area of a first region on the left side of the short axis may be greater than an area of a second region on the right side of the short axis.

The micro disk laser of claim 1, wherein the oval shape of the micro disk is defined as the formula below:

Formula $$\frac{x^2}{a^2} + \frac{y^2}{b^2}(1 + \varepsilon x) = r_0^2 (\varepsilon \neq 0).$$

The micro disk may satisfy the formulas below:
Formulas $1.02 < b/a < 1.6$, and $0.05 < \varepsilon < 0.2$.

A diameter of the micro disk may be equal to or less than 1.5 μm.

Four to six wavelengths may be confined to the micro disk and may unidirectionally emit.

The micro disk may include a first semiconductor layer, a quantum well layer, and a second semiconductor layer, and the first semiconductor layer, the quantum well layer, and the second semiconductor layer may be sequentially arranged on a substrate and may have the oval shape.

The micro disk laser may further include a power supply and an upper contact electrode arranged on the second semiconductor layer and configured to supply current from the power supply to the micro disk.

The micro disk laser may further include a lower contact electrode between the substrate and the first semiconductor layer. The substrate may include indium phosphide.

The micro disk may emit light having a wavelength of 1550 nm.

MODE OF DISCLOSURE

Embodiments of the present disclosure will be described in detail hereinafter with reference to the accompanying drawings so as to be easily implemented by one of ordinary skill in the art to which the present disclosure belongs. The present disclosure may, however, be embodied in many different forms and is not limited to the embodiments set forth herein. Portions irrelevant to descriptions will be omitted from the drawings for clarity. In the drawings, like numbers refer to like elements throughout.

Terms used in the specification are briefly described before the present disclosure is described in detail.

Terms used herein are selected from general ones that are widely used at present, as much as possible, considering functions in the present disclosure, but the terms may be changed according to the intention of those skilled in the art, precedents, or the appearance of new technology. In particular cases, some terms are selected at an applicant's discretion, and the meanings of the terms will be explained in detail in corresponding descriptions. Accordingly, the terms used herein are not just names and should be defined based on the meanings of the terms and the entire content of the specification.

In the specification, when a portion "comprises" or "includes" an element, it means that the portion may further comprise or include other elements and does not preclude the presence other elements unless stated otherwise. As used herein, the terminology such as "part", "~er", or "~or" may indicate a unit which processes at least one function or operation. When a portion is referred to as being "connected" or "coupled" to another portion, it may be "directly connected or coupled" to the other portion or may be "connected" to the other portion with an intervening element therebetween.

Hereinafter, the present disclosure will be described in detail with reference to the drawings.

Figure 1A:
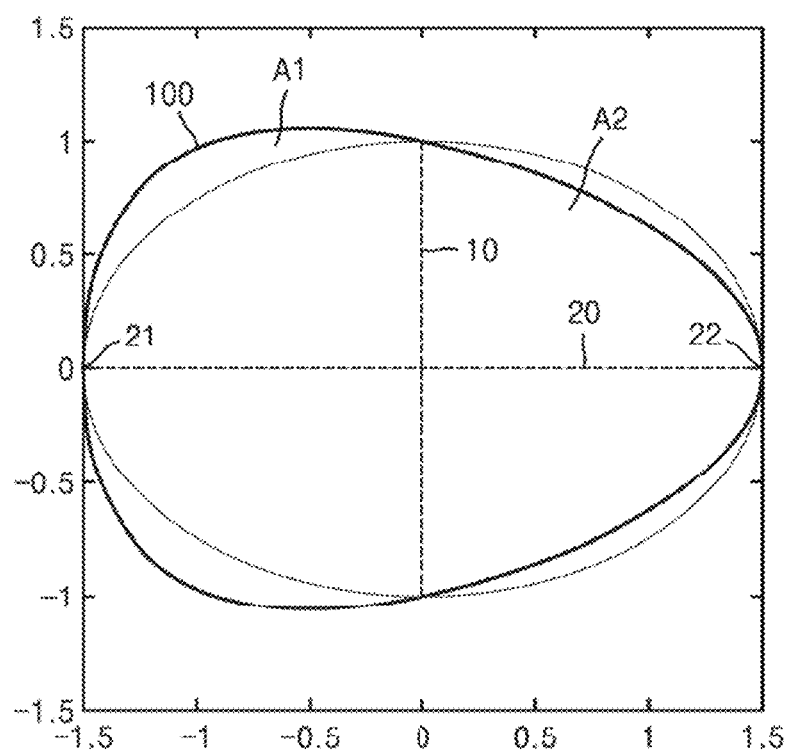
FIG. 1A illustrates an oval shape micro disk (bold line, δ=0.4) modified from an ellipse (thin line, a modification factor δ of the ellipse is 1.5).
Figure 1B:
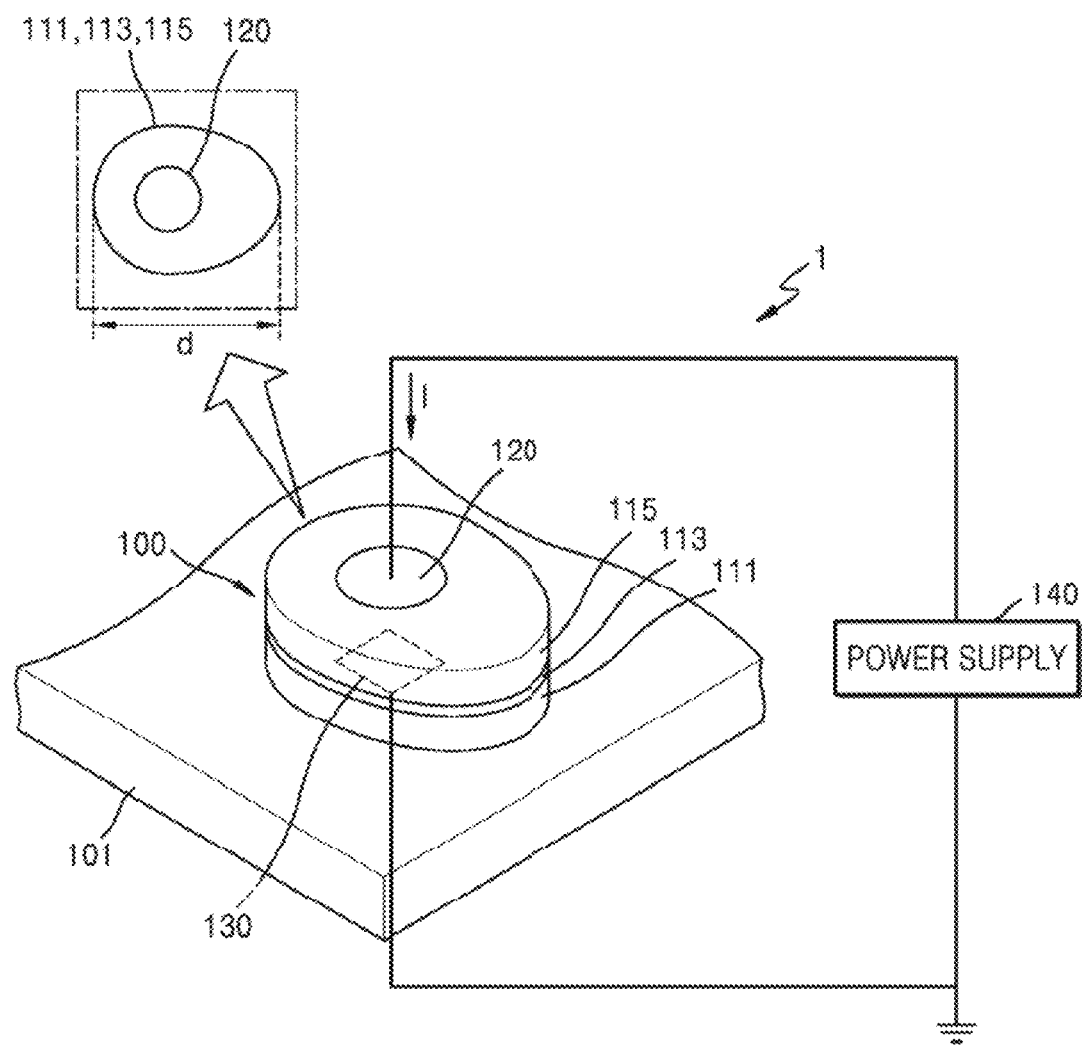
FIG. 1B is a schematic perspective view of a micro disk laser including the micro disk in FIG. 1A.

FIG. 1A illustrates an oval shape micro disk (bole line, ε=0.4) modified from an ellipse (thin line, a modification factor δ of the ellipse is 1.5). FIG. 1B is a schematic perspective view of a micro disk laser including the micro disk in FIG. 1A.

Referring to FIG. 1A, according to an embodiment, a micro disk 100 has a greater emission intensity in one direction than in another direction, in other word, emits in one direction. The micro disk 100 may have an oval shape obtained by changing a length of an axis parallel to a short axis 10 of an ellipse, which has a long axis 20 and the short axis 10 having a different length than the long axis 20, according to the position of the long axis 20 while lengths between first and second side portions 21 and 22 of the long axis 20 are fixed in the ellipse. The first side portion 21 of the long axis 20 refers to a left or right portion of the long axis 20 around an origin, and correspondingly, the second side portion 22 refers to a right or left portion of the long axis 20 around the origin. According to an embodiment, the micro disk 100 may have a structure called oval shape, which is obtained by deforming an ellipse. Such structure may be defined by Equation 1.

$$\frac{x^2}{a^2} + \frac{y^2}{b^2}(1 + \varepsilon x) = r_0^2 (\varepsilon \neq 0),$$ [Equation 1]

wherein "a" and "b" are respectively a long length and a short length of the ellipse and ε is a modification factor. When ε is 0 in Equation 1, the structure is an ellipse. The ellipse (a black line) in FIG. 1 appears when a=1.5, b=1.0, and $r_0$=1.0 (where a unit is an arbitrary unit). An aspect ratio δ of the ellipse is given by Equation 2.

$$\delta = b/a. \quad \text{[Equation 2]}$$

According to these equations, the size of the oval shape may be determined depending on a value of "a" and the oval shape may be determined depending on ε and δ. At this time, when a trajectory of light according to internal reflection is obtained while values of ε and δ are changed, how the light comes out may be seen. When the values of ε and δ are appropriately adjusted in calculation of a trajectory using ray tracing, characteristics of a unidirectionally emitting disk resonator may be realized. According to an embodiment, the micro disk 100 of FIG. 1 shows an oval shape when ε=0.4.

According to an embodiment, four through six wavelengths may be confined to a unidirectionally emitting micro disk laser including the micro disk 100 and may emit in one direction. When seven or more wavelengths are confined to the micro disk laser, unidirectional emission may be achieved. However, the micro disk 100 is an extremely small micro disk that has a size of about 1.5 μm or less, and therefore, it is hard to confine seven or more wavelengths to the micro disk 100. When wavelengths fewer than four are confined, unidirectional emission may not be achieved.

When a value of ε is not zero in the micro disk 100, the micro disk 100 becomes a chaotic resonator. When the size of a chaotic resonator decreases, a wavelength is relatively long with respect to the size of the chaotic resonator, and therefore, it is hard to obtain unidirectional emission. Accordingly, the size of a chaotic resonator is usually limited. Contrarily, in the case of an oval-shaped resonator according to an embodiment, three islands, i.e., trajectories, forming a triangle exist in Birkhoff coordinates. When a wavelength is confined to such an island, i.e., a trajectory, forming a triangle, it is hard for the confined wavelength to escape from the island, and therefore, a confined wavelength occurs. The light of confined wavelength may emit outside through tunneling from resonator.

At this time, when laser emission conditions are searched for while the values of the modification factors ε and δ are being adjusted, the conditions under which unidirectional emission is performed even when the size of a resonator, i.e., the micro disk 100, for example, the size of a micro disk laser 1 in a semiconductor laser having a refractive index of 3.3, is less than a wavelength may be obtained.

Referring to FIG. 1B, the micro disk laser 1 emitting in one direction may be formed using the micro disk 100 having an oval shape obtained by deforming an ellipse.

According to an embodiment, the micro disk laser 1 includes a first semiconductor layer 111 and a second semiconductor layer 115, which are arranged on a substrate 101. A quantum well layer 113 is formed between the first semiconductor layer 111 and the second semiconductor layer 115.

Each of the first semiconductor layer 111, the quantum well layer 113, and the second semiconductor layer 115 has a disk shape. In other words, a semiconductor laser itself may form the micro disk 100 that functions as a resonator. According to an embodiment, each of the first semiconductor layer 111, the quantum well layer 113, and the second semiconductor layer 115 may have an oval-shaped plane viewed in a direction perpendicular to the substrate 101. A length "d" of a longest side, i.e., a diameter, passing the center of the micro disk 100 may be equal to or less than an emission wavelength. The length "d" of the longest side of the micro disk 100 may be defined as the size of the micro disk laser 1.

According to an embodiment, the substrate 101 may include indium phosphide (InP), and the first semiconductor layer 111 and the second semiconductor layer 115 may be a p-type semiconductor and an n-type semiconductor, respectively, or an n-type semiconductor and a p-type semiconductor, respectively. For example, the quantum well layer 113 may include InGaAsP, and luminous efficiency may be different according to the refractive index of the quantum well layer 113. A semiconductor laser including the first semiconductor layer 111, the quantum well layer 113, and the second semiconductor layer 115 may emit light having a wavelength of, for example, 1550 nm. The length "d" of the diameter of the micro disk 100 may be equal to or less than 1.5 μm, which is less than the wavelength. The length "d" of the diameter of the micro disk 100 may be 70% of the wavelength of emitted light or less and may thus be equal to or less than 1.1 μm.

An upper contact electrode 120 may be arranged on the second semiconductor layer 115, and a lower contact electrode 130 may be arranged between the substrate 101 and the first semiconductor layer 111. The upper contact electrode 120 may be connected to a power supply 140 to efficiently provide a current I to the semiconductor laser. The lower contact electrode 130 may be grounded. Although not shown, the micro disk laser 1 may further include a current transferring electrode (not shown) having a bridge shape to provide current from the power supply 140 to the upper contact electrode 120.

In a chaotic system like a modified micro resonator, the trajectory of light is chaotic, but unstable fixed points exist in a chaotic signal. Such unstable fixed points start from a single point and return to an original position after being reflected from other boundary surfaces, and this traveling is called an unstable periodic orbit. For example, there is a trajectory forming a triangle when light starts from an unstable fixed point, is reflected from two different boundary surfaces, and returns to an original position. This trajectory is called period-3 of an unstable periodic orbit. There is a trajectory forming a quadrangle when light starts from an unstable fixed point, is reflected from three different boundary surfaces of a resonator, and returns to an original position. This trajectory is called period-4. There are countless unstable points in a chaotic trajectory, and therefore, there are countless periodic orbits. Besides these unstable periodic orbits, a chaotic region and a stable region may simultaneously appear in a chaotic resonator. Periodic orbits appearing in the stable region have the same pattern as those in the chaotic trajectory. Laser modes emitting in a modified micro resonator may be modes confined to periodic orbits. According to an embodiment, confined modes may unidirectionally emit. According to another embodiment, when only one of periodic orbits is selected and excited, only a mode confined to the selected periodic orbit may be emitted.

According to an embodiment, the micro disk laser 1 may be obtained by setting the value of the modification factor δ after an ellipse is determined according to Equation 2. The upper contact electrode 120 is applied to a top surface of the micro disk 100 in the structure (e.g., the oval shape) described above, and power from the power supply 140 may be provided to the upper contact electrode 120 connected to the micro disk 100.

Referring to FIGS. 1A and 1B, according to an embodiment, the micro disk 100 may include a curved surface only, and left and right sides of the micro disk 100 may be asymmetrical with each other with respect to the short axis 10 of the ellipse. In other words, the left side may have a mean radius of curvature different than the right side. For example, a curved portion on the left of the short axis 10 may have a greater mean radius of curvature than a curved portion on the right of the short axis 10.

In the modified ellipse of the micro disk 100, an area on the left side of the short axis 10 may be different from an area on the right side of the short axis 10. The area of a first region A1 on the left of the short axis 10 may be greater than the area of a second region A2 on the right of the short axis 10. In detail, when the micro disk 100 is folded along the short axis 10 so that the first region A1 overlaps the second region A2, the second region A2 may be fully included within the first region A1.

As described above, when the eccentricity of an ellipse for the micro disk 100 and a modification ratio, at which the length of the short axis 10 changes with respect to the position of the long axis 20, are changed (or adjusted), the micro disk laser 1 that emits in one direction and has a size equal to or less than an emission wavelength may be realized.

According to an embodiment, the micro disk laser 1 having an oval structure is characterized by unidirectional emission and a laser size less than an emission wavelength. In other words, the longest diameter, i.e., the long axis 20, of the micro disk 100 may be equal to or less than an emission wavelength of the unidirectionally emitting micro disk laser 1.

Here, the term "unidirection" does not mean one direction in a mathematical sense but may mean that a divergence angle is within a range of about 20 degrees. The expression "unidirectional emission" does not strictly mean that light is emitted from the micro disk laser 1 in one direction, i.e., at a divergence angle within the range of about 20 degrees. For example, "unidirectional emission" may mean that the intensity of light emitted in one direction is equal to or greater than 60% of the intensity of light emitted from the entirety of the micro disk laser 1.

Referring to FIGS. 1A and 1B and Equation 1, an ellipse having δ=1.5 may have an elliptical shape (i.e., a black-lined region in FIG. 1A) when the modification factor ε is 0. At this time, when the modification factor ε is increased, the black-lined region may be changed into a red-lined structure (obtained when ε=0.4) shown in FIG. 1A. A resonator having such a shape may be referred to as an oval resonator. The directionality of emission of the oval resonator may be checked using ray tracing while the modification factor ε and a ratio, i.e., ε, of a long axis and a short axis of an ellipse, are being adjusted. In other words, it may be confirmed through ray tracing that the micro disk 100 has unidirectional emission when the micro disk 100 has an oval shape.

According to an embodiment, the value of δ, i.e., b/a, defining the shape of the micro disk 100 may be greater than 1.02 and less than 1.6, the value of ε may be greater than 0.05 and less than 0.5, and the micro disk laser 1 including the micro disk 100 having a shape within these ranges may be capable of unidirectional emission even when the micro disk laser 1 is extremely small.

For example, it was confirmed that the micro disk laser 1 has a very high unidirectional emission when δ=1.06 and ε=0.13. At this time, the refractive index of the quantum well layer 113 was set to 3.3.

When the longest diameter of the micro disk laser 1 is less than a wavelength, a resonant mode may be formed inside a resonator due to the uncertainty principle. The resonant mode may unidirectionally emit with a directionality.

Figure 2A:
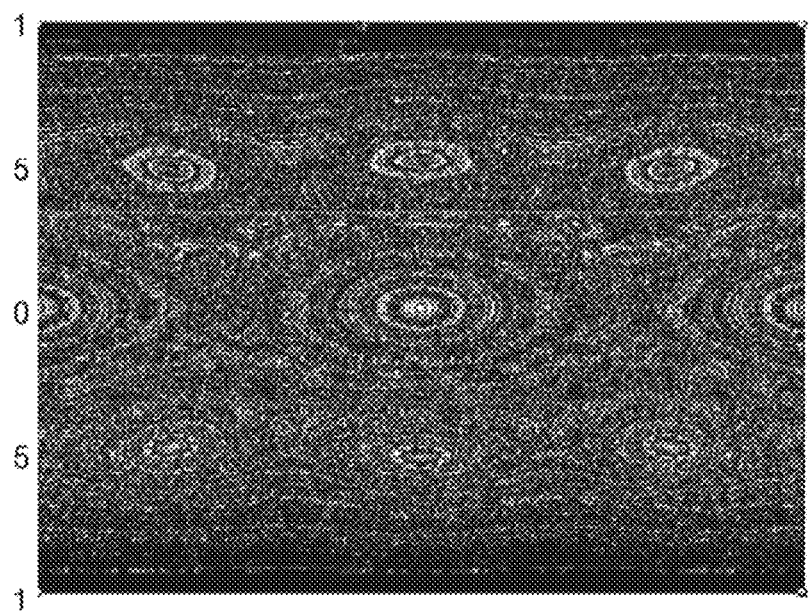
FIG. 2A shows a classical trajectory in a Birkhoff coordinate system when variables δ and ε defining the shape of a micro disk are 1.06 and 0.13, respectively, and a refractive index of a quantum well layer is 3.3.
Figure 2B:
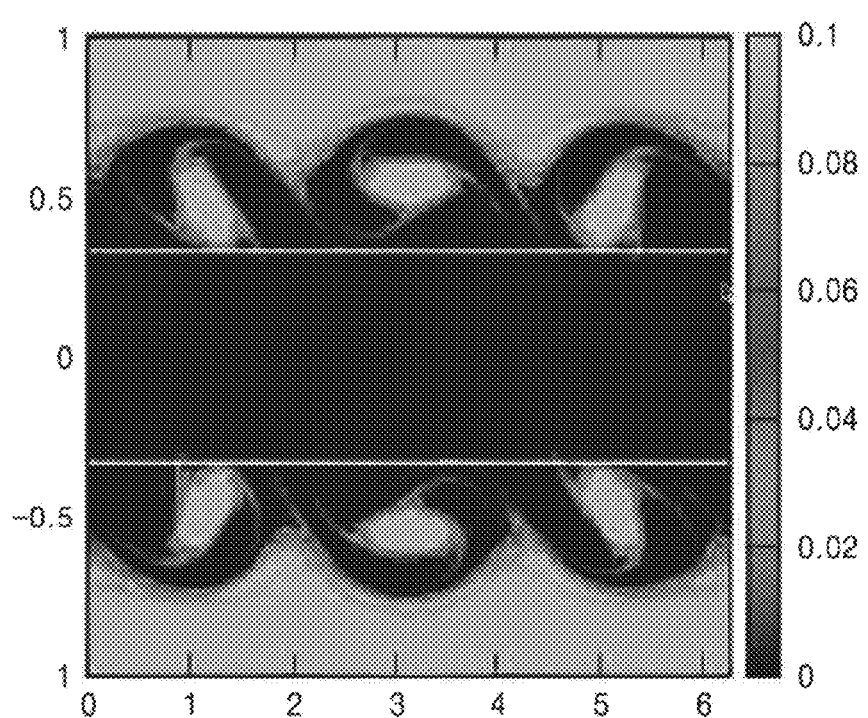
FIG. 2B shows survival probability distribution when variables δ and ε defining the shape of a micro disk are 1.06 and 0.13, respectively, and a refractive index of a quantum well layer is 3.3.

FIGS. 2A and 2B are diagrams showing characteristics of a chaotic resonator obtained by using ray dynamics when variables d and e defining the shape of a micro disk are 1.06 and 0.13, respectively, and a refractive index of a quantum well layer is 3.3. FIG. 2A shows a trajectory of a Poincaré cross-section in a Birkhoff coordinate. In the Birkhoff coordinate system, an incident angle of light is set to q when the light is incident to the boundary inside a resonator, and, at this time, p=sin q is set as a momentum and is expressed as a y-axis and a coordinate "x" is the length from an x-axis to a point where a light reflect. When an incident angle and a position that the light reflects are plotted in the Birkhoff coordinate whenever the light hits the boundary, the characteristics of the chaotic resonator may be seen, as shown in FIG. 2A. At this time, an elliptical shape appearing when p=0.5 is referred to as an island. The island represents a stable orbit, and a region having irregular points is referred to as a chaotic sea. An unstable orbit exists in the chaotic sea. A resonant mode of a laser in the chaotic resonator is localized to an unstable orbit or a stable orbit. FIG. 2B shows survival probability distribution. FIG. 2B is a diagram obtained when trajectories of light remaining inside a resonator are represented as described with reference to FIG. 2A, wherein the resonator is a dielectric and some of the light escapes from the resonator. Referring to FIG. 2B, a period-3 island chain appears and a trajectory showing a chaotic characteristic appears in the other region. Here, a chaotic region refers to a region in which unidirectional emission occurs when a laser size is large, and an island chain region refers to a region in which a laser mode is localized when a laser size is equal to or less than a wavelength.

FIG. 3A is a diagram of a shape, in which light spreads out of a resonator, obtained using ray tracing when variables δ and ε defining the shape of a micro disk are 1.06 and 0.13, respectively, and a refractive index of a quantum well layer is 3.3. Referring to FIG. 3A, it may be seen that an oval-shaped micro disk laser unidirectionally emits. FIG. 3B is a diagram of a far-field pattern showing the directionality of light at a long range using ray tracing and shows the emission direction of FIG. 3A obtained using the ray tracing by way of measuring the intensities of light at a long range according to angles. Referring to FIG. 3B, it may be seen that a laser unidirectionally emits.

As described above, the term "unidirection" does not mean one direction in a mathematical sense but may mean that a divergence angle of emitted light is within a range of about 20 degrees. The expression "unidirectional emission" may mean that at least 60% of light emitted from the micro disk laser emits at a divergence angle within the range of about 20 degrees.

FIG. 4 shows a result of estimating emission of a resonant mode while decreasing a laser size to check how small an oval-shaped laser can be with unidirectionality being kept. Since the refractive index of a quantum well layer including InGaAsP or silicon is about 3.3, the directionality of emission of a laser may be checked by obtaining a wave function in a state where the refractive index of the quantum well layer is set to 3.3. For example, when δ=1.06 and ε=0.05, unidirectional emission may be achieved even when five waves are confined to a boundary surface in an oval-shaped resonator according to an embodiment. In other words, when the size of a micro disk laser decreases, a wave is not confined to the boundary surface or only a small number of waves are confined to the boundary surface. In this case, emission itself may not occur, or it may be hard to achieve unidirectional emission.

However, as for an oval-shaped micro disk laser, waves may be confined to the boundary surface even when a laser size is equal to or less than an emission wavelength, and the waves may unidirectionally emit.

FIG. 5 shows a directionality when five waves confined to a boundary surface under the conditions obtained in FIG. 4 emit. Referring to FIG. 5, it may be seen that light is unidirectionally emitted in an oval-shaped micro disk laser according to an embodiment even when the size of the micro disk laser is equal to or less than an emission wavelength.

Micro resonator lasers that unidirectionally emit under several conditions have been designed up to now, but there have been implementations in which extremely small micro resonator lasers unidirectionally emits as in the embodiments of the present disclosure. For example, in the case of a Limagon resonator, a laser unidirectionally emits when at least 15 resonant modes are confined inside the resonator. However, according to an embodiment of the present disclosure, an oval-shaped micro resonator laser may unidirectionally emit even when only four to six, e.g., five, resonant modes are confined inside the laser. In addition, a diameter of the oval-shaped micro resonator laser may be as small as about 70% of an emission wavelength such that a laser smaller than a wavelength may be effectively manufactured. Since such a laser according to an embodiment may be excited by current at room temperature, the laser may be applied to not only high-sensitivity sensors but also various fields including chip-level optical interconnection requiring light sources as small as several hundreds of nm to several μm.

According to an embodiment, when the directionality of emission is obtained while δ and ε are being changed, unidirectionally emitting lasers may be implemented under various conditions.

When characteristics of laser beam emitted in a micro disk according to an embodiment are interpreted based on the concept of quantum chaos and a wave function is obtained from the emission characteristics using ray tracing, a space-time differential equation, a boundary element method, etc., the directionality of emission may be clearly interpreted, and accordingly, a micro disk laser according to an embodiment may be optimally designed. The concept of quantum chaos may be used to obtain characteristics of modes occurring in a micro-space and to obtain the modes. The space-time differential equation may be used as a tool for explaining patterns in the natural world and changes in the patterns over time. When laser modes emitted from a micro disk are analyzed using both the space-time differential equation and the concept of quantum chaos, what shape of a laser may bring an effective directionality is identified. When a micro laser is designed based on the analytical methods described above, the direction of emission and characteristics of the micro laser may be identified.

The embodiments described above are exemplary, and it will be understood by one of ordinary skill in the art to which the present disclosure belongs that the embodiments may be easily modified into other specific forms without changing the technical ideas or essential characteristics of the present disclosure. Accordingly, the embodiments described above should be considered as examples and not for purposes of limitation. For example, an element described as a single form may be implemented in a distributed fashion, and elements described as being distributed may be implemented in a combined form.

The scope of the embodiments is defined not by the detailed description above but by the appended claims. All changes or modifications drawn from the spirit and scope of the claims and their equivalent concept will be construed as being included in the scope of the embodiments.

INDUSTRIAL APPLICABILITY

The present disclosure may be used in the field of unidirectionally emitting micro disk lasers.

The invention claimed is:

1. A micro disk laser having a greater strength of emission intensity in one direction than in another direction and unidirectionally emitting, the micro disk laser comprising a micro disk having an oval shape corresponding to a modified ellipse obtained by changing a length of an axis parallel to a short axis of an ellipse according to a position of a long axis while lengths of first and second side portions of the long axis are fixed in the ellipse, the ellipse having the long axis and the short axis having a different length than the long axis;

wherein the micro disk includes a curved surface only, and the micro disk is asymmetrical with each other with respect to the short axis.

2. The micro disk laser of claim 1, wherein a diameter of the micro disk is equal to or less than 1.5 μm.

3. The micro disk laser of claim 2, wherein four to six wavelengths are confined to the micro disk and unidirectionally emit.

4. The micro disk laser of claim 1, wherein the micro disk includes a first semiconductor layer, a quantum well layer, and a second semiconductor layer, and the first semiconductor layer, the quantum well layer, and the second semiconductor layer are sequentially arranged on a substrate and have the oval shape.

5. The micro disk laser of claim 4, further comprising:
a power supply; and
an upper contact electrode arranged on the second semiconductor layer and configured to supply current from the power supply to the micro disk.

6. The micro disk laser of claim 4, further comprising a lower contact electrode between the substrate and the first semiconductor layer,
wherein the substrate includes indium phosphide.

7. The micro disk laser of claim 1, wherein the micro disk emits light having a wavelength of 1550 nm.

8. A micro disk laser having a greater emission intensity in one direction than in another direction and unidirectionally emitting, the micro disk laser comprising a micro disk having an oval shape corresponding to a modified ellipse obtained by changing a length of a axis parallel to a short axis of an ellipse according to a position of a long axis while lengths of first and second side portions of the long axis are fixed in the ellipse, the ellipse having the long axis and the short axis having a different length than the long axis, wherein the oval shape of the micro disk is defined as:

$$\frac{x^2}{a^2} + \frac{y^2}{b^2}(1+\varepsilon x) = r_0^2 (\varepsilon \neq 0)$$

wherein x is a x coordinate on a x-axis, y is a y coordinate on a y-axis, a is a long length of the ellipse on the x-axis, b is a short length of the ellipse on the y-axis, ε is a modification factor, and $r_0$ is a value equal to 1.

9. The micro disk laser of claim 8, wherein the micro disk satisfies $1.02<b/a<1.6$ and $0.05<\varepsilon<0.2$.

* * * * *